(12) United States Patent
Kim et al.

(10) Patent No.: US 6,862,303 B2
(45) Date of Patent: Mar. 1, 2005

(54) MULTIWAVELENGTH LOCKING METHOD AND APPARATUS USING ACOUSTO-OPTIC TUNABLE FILTER

(75) Inventors: Bong Kyu Kim, Daejon (KR); Kwang Joon Kim, Daejon (KR); Byoung-Sung Kim, Kangwon-do (KR); Hae Geun Kim, Daejon (KR)

(73) Assignee: Electronics & Telecommunications Research Institute (KR)

( * ) Notice: Subject to any disclaimer, the term of this patent is extended or adjusted under 35 U.S.C. 154(b) by 393 days.

(21) Appl. No.: 10/196,465

(22) Filed: Jul. 15, 2002

(65) Prior Publication Data

US 2003/0112836 A1 Jun. 19, 2003

(30) Foreign Application Priority Data

Dec. 18, 2001 (KR) ........................................ 2001-80895

(51) Int. Cl.$^7$ ............................................... H01S 3/13
(52) U.S. Cl. ......................................................... 372/32
(58) Field of Search ............................. 372/13, 18, 32; 398/1; 250/214 R, 227.23

(56) References Cited

U.S. PATENT DOCUMENTS

| | | | |
|---|---|---|---|
| 5,208,819 A | 5/1993 | Huber | 372/32 |
| 5,825,792 A | 10/1998 | Villeneuve et al. | 372/32 |
| 6,094,446 A | 7/2000 | Tei et al. | 372/32 |
| 6,118,562 A | 9/2000 | Lee et al. | 398/1 |
| 6,233,262 B1 | 5/2001 | Mesh et al. | 372/32 |
| 6,240,109 B1 | 5/2001 | Shieh | 372/18 |
| 6,291,813 B1 | 9/2001 | Ackerman et al. | 250/214 R |
| 6,548,806 B1 * | 4/2003 | Chung et al. | 250/227.23 |
| 6,643,060 B2 * | 11/2003 | Hashimoto et al. | 359/346 |

OTHER PUBLICATIONS

Optics Letters, Jan. 1, 1996, vol. 21, No. 1, "All–fiber tunable filter and laser based on two–mode fiber," pp. 27–29 Yun,S et al.
Optics Letters, Jun. 1986, vol. 11, No. 6, pp. 389–391 Kim et al "All–fiber Acousto–optic FrequencyShifter" Jun. 1986.

* cited by examiner

*Primary Examiner*—Quyen Leung
(74) *Attorney, Agent, or Firm*—Blakely Sokoloff Taylor & Zafman

(57) ABSTRACT

Disclosed is a multiwavelength locking method and apparatus using an acousto-optic tunable filter in an optical communication system including optical transport networks, in which output wavelengths of light sources are monitored under the condition in which pilot signals are applied to the acousto-optic tunable filter, so as to lock the wavelengths of the light sources, thereby eliminating an wavelength instability of the light sources for an improvement in transmission characteristics. The acousto-optic tunable filter receives light beams of N different frequencies respectively outputted from N light sources, along with N pilot signals having different frequencies, and converts respective frequencies of beam components of the output beam corresponding to the N pilot signals, thereby outputting N frequency-converted output beams to be applied to a photo-detector. N electrical signals respectively corresponding to the frequencies of the pilot signals are outputted from the photo-detector, separated from one another while corresponding to the light sources, respectively, and then used to compensate for respective output wavelengths of the light sources, thereby enabling the corresponding light sources to output locked wavelengths, respectively.

14 Claims, 3 Drawing Sheets

MULTIWAVELENGTH LOCKING METHOD AND APPARATUS USING ACOUSTO-OPTIC TUNABLE FILTER

BACKGROUND OF THE INVENTION

1. Field of the Invention

The present invention relates to a multiwavelength locking method and apparatus using an acousto-optic tunable filter, and more particularly to a multiwavelength locking method and apparatus using an acousto-optic tunable filter in an optical communication system including optical transport networks, in which output wavelengths of light source are monitored under the condition in which pilot signals are applied to the acousto-optic tunable filter, so as to lock the output wavelengths of the light sources, thereby eliminating an wavelength instability of the light sources for an improvement in transmission characteristics.

2. Description of the Related Art

Recently, high-speed interchange services and broadband image services have been made commercially available. As a result, an increase in the transmission capacity of communication networks has been required. Transmission of a large quantity of data has also been required in the construction of ultra-high speed communication networks, due to desires of consumers for convenience, and development of techniques and information communications. In order to meet such requirements, various methods for achieving an increase in communication speed have been proposed. Among these methods, a wavelength division multiplexing (WDM) technique adapted to simultaneously transmit different wavelengths through a signal optical fiber is being most actively studied because it allows communication over broad bandwidths.

Where such a WDM transmission scheme is applied to an optical communication system, channels are arranged at a certain wavelength interval, and signals are carried through those channels. These channels are transmitted through a single optical fiber after being optically multiplexed. In order to stabilize power intensities of diverse light sources used in this system, thereby achieving an improvement in transmission characteristics, locking of multiwavelengths is performed. As a method for simultaneously locking wavelengths of diverse light sources, a method adapted to directly apply a pilot signal to light sources has been mainly used. On the other hand, as a method for locking the wavelength of a single light source, wavelength locking techniques using a filter having a wavelength dependency such as a Fabry-Perot filter, a fiber Bragg grating, or an arrayed waveguide grating have been mainly used.

Now, a typical wavelength locking method for locking a wavelength of a single light source having a single wavelength will be described in brief.

First, beam outputted from the light source is split into two beams. And then each of the beams is passed through optical elements having different transmittances each other according to wavelength. In this case, when two optical elements which have different transmitting wavelength characteristics in terms of a transmitting wavelength peak value or the gradient of a variation in transmittance depending on a variation in wavelength are used, the ratio between the intensities of the beams passed through the two optical elements is varied each other depending on a variation in wavelength. Accordingly, wavelength locking can be achieved by controlling two light beams to have the same intensity or a desired ratio, thereby causing the light beam emitted from the light source to have a constant wavelength. (U.S. Pat. No. 6,094,446. 2000: D. Tei, et al., "Wavelength Stabilization Apparatus of Laser Source").

Meanwhile, dense wavelength division multiplexing (DWDM) systems use a method for multiplexing beams outputted from light sources having different wavelengths distributed at a certain wavelength interval, and transmitting the multiplexed light beams. In this case, locking of the wavelength of each light source causes an increase in costs and an increase in system size because a number of light sources are used. In order to solve this problem, active research efforts have been made to simultaneously lock a number of different wavelengths. As a method for simultaneously locking diverse wavelengths, a method using pilot signals has been mainly used. In accordance with this method, pilot signals of different frequencies are applied to each of the light sources. An output signal having diverse multiplexed wavelengths is then observed at respective frequencies of the pilot signals. Thus, output characteristics of each of the light sources can be determined. For example, pilot signals having frequencies of f1, f2, . . . , and fn are applied to each of the light sources 1, 2, . . . , and n. Using a photo-detector, an optical signal obtained by multiplexing the output signals from the light sources 1, 2, . . . , and n by a DWDM system is detected at respective frequencies of the pilot signals. Based on the detected results, each of the wavelengths of the light sources can be locked in accordance with the wavelength locking method for a single light source. However, the wavelength locking method using pilot signals has a problem in that errors may be generated in optical signals because a variation in the power intensity of each light source may occur. (U.S. Pat. No. 6,118,562. 2000: H. J. Lee, et al., "Wavelength Aligning Apparatus Using Arrayed Wavelength Grating").

Meanwhile, an acousto-optic frequency converter has been developed which utilizes characteristics of an optical signal varying in wavelength or frequency when acoustic waves interfere with the optical signal. Such an acousto-optic frequency converter is used as an optical modulator or a wavelength filter. In the case of an acousto-optic wavelength filter using optical fibers, a variation in transmitting wavelength occurs depending on a variation in the frequency of acoustic waves applied to the filter. That is, wavelength shift occurs in proportion to a variation in frequency. For this reason, it has been required to develop a method for simultaneously locking multiwavelengths using an acousto-optic wavelength filter exhibiting a variation in transmitting wavelength and a variation in frequency conversion depending on a variation in the frequency of acoustic waves applied thereto.

SUMMARY OF THE INVENTION

Therefore, an object of the invention is to provide a multiwavelength locking method and apparatus using an acousto-optic tunable filter, in which a pilot signal is not directly applied to a light source, but applied to the acousto-optic tunable filter of which a transmitting wavelength and a frequency conversion are different through the filter according to the frequency of acoustic waves, so that it is possible to reduce the level of signal noise caused by the pilot signal in a multiwavelength locking method in which a pilot signal is directly applied to a light source.

Another object of the invention is to provide a simultaneous multiwavelength locking method and apparatus in which multiple different wavelengths are simultaneously locked using filters under the condition in which electrical pilot signals having different frequencies are simultaneously applied to an acousto-optic frequency converter.

In accordance with one aspect, the present invention provides a multiwavelength locking method using an acousto-optic tunable filter being connected to output terminals of N light sources and outputting beams of N different wavelengths outputted from the light sources in the form of an output beam having N frequencies, the multiwavelength locking method comprising the steps of: (A) applying the output beam having the N frequencies outputted from a multiplexer and N pilot signals to an acousto-optic tunable filter; (B) splitting an output beam outputted from the acousto-optic tunable filter, the output beam having the N frequencies, into two beams, detecting an intensity signal from a first one of the split beams, and detecting a wavelength signal and an intensity signal from a second one of the split beams; (C) detecting intensity signals of the first beam respectively corresponding to the N frequencies, and detecting intensity signals and wavelength signals of the second beam respectively corresponding to the N frequencies; and (D) detecting wavelength signals respectively corresponding to the light sources on the basis of the intensity signals of the first beam and the intensity signals and the wavelength signals of the second beam according to the N frequencies, comparing each of the detected wavelength signals with each of wavelength signals of the beams outputted from the light sources, and compensating for a difference between the compared wavelength signals.

In accordance with another aspect, the present invention provides a multiwavelength locking apparatus using an acousto-optic tunable filter being connected to output terminals of N light sources and locking output wavelengths of the light sources using respective light beams of N different wavelengths outputted from the light sources, comprising an optical splitter, a wavelength detecting filter, a wavelength discriminator, a photo-detector, and a frequency filter adapted to allow signals of a specific frequency to pass therethrough, further comprising:

an acousto-optic tunable filter for receiving the light beams having N different frequencies respectively outputted from the light sources, along with N pilot signals having N different frequencies respectively, and converting each of the frequencies of output beams corresponding to the N pilot signals, whereby, the N frequency-converted output beams from the acousto-optic tunable filter are inputted to the photo-detector, then N electrical signals respectively corresponding to the N frequencies of the pilot signals are outputted through the photo-detector, separated from one another according to the light sources respectively, and then used to compensate for each of the output wavelengths of the light sources, thereby enabling the corresponding light sources to output locked wavelengths respectively.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, the present invention will be described in detail with reference to the annexed drawings illustrating an embodiment of the present invention.

Figure 1:
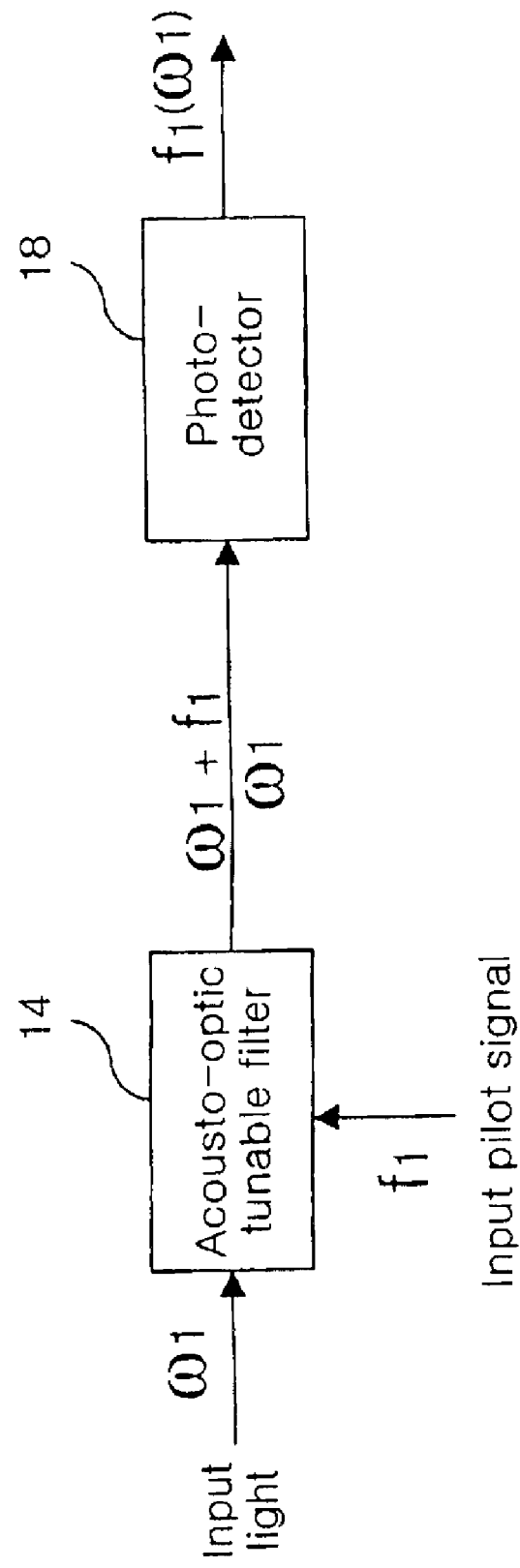
FIG. 1 is a diagram illustrating output characteristics of an acousto-optic tunable filter according to an embodiment of the present invention.

FIG. 1 is a diagram illustrating output characteristics of an acousto-optic tunable filter according to an embodiment of the present invention. When input beam having an optical frequency of ω1 is applied to the acousto-optic tunable filter 14 along with a pilot signal having a frequency of f1, a part of the input beam is converted in its optical frequency from "ω1" to "ω1+f1", and the remaining beam part, and the remaining part of the input beam maintains the optical frequency of ω1 as the input beam passes through the acousto-optic tunable filter 14. In this case, the ratio between the frequency-converted beam and the non-converted beam is adjustable by controlling the intensity of the pilot signal applied to the acousto-optic tunable filter 14. The pilot signal is preferably an electrical signal. Accordingly, an electrical signal having a frequency of f1 is outputted from the photo-detector 18 in accordance with an interference between the frequency-converted beam and non-converted beam exhibited when the ratio between the frequency-converted beam and non-converted beam is properly adjusted. The magnitude of the outputted electric signal is related to the intensities of the frequency-converted beam and non-converted beam.

The magnitude of the electrical signal having a frequency of f1, detected by the photo-detector 18, is proportional to the intensity of the beam having an optical frequency of ω1. Based on the electrical signal, the intensity of the beam having an optical frequency of ω1, which corresponds to the pilot signal having a frequency of f1, is measured. Accordingly, it is possible to measure the intensity of the beam inputted to the acousto-optic tunable filter 14, based on the magnitude of the pilot signal outputted from the photo-detector 18 via the acousto-optic tunable filter 14.

Here, it should be noted that the acousto-optic tunable filter 14 does not frequency-convert beam components of all optical frequencies (or wavelengths), but frequency-converts a beam component of a specific optical frequency while allowing frequency components having optical frequencies other than the specific optical frequency to pass therethrough without being frequency-converted. In the illustrated embodiment, only when a pilot signal having a frequency of f1, that is, a specific frequency in association with the optical frequency of ω1, is inputted, the input beam is partially frequency-converted. Also, a pilot signal having the specific frequency of f1 associated with the frequency of ω1 is outputted.

Figure 2:
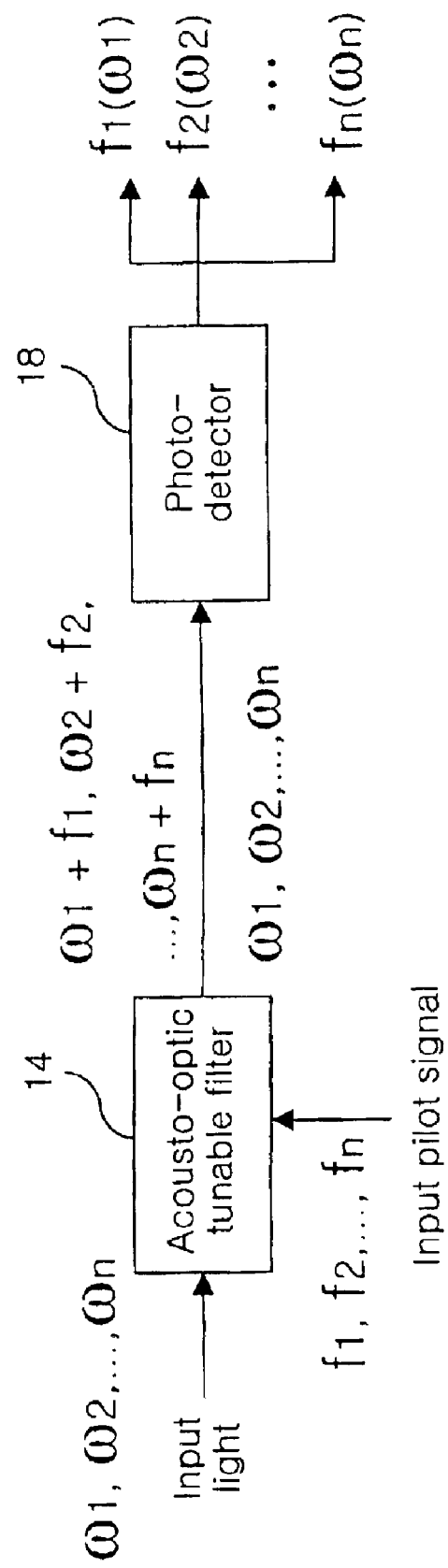
FIG. 2 is a diagram illustrating output characteristics exhibited when pilot signals of diverse frequencies are applied to the acousto-optic tunable filter according to the embodiment of the present invention.

When pilot signals of diverse frequencies are simultaneously applied to the acousto-optic tunable filter 14 in accordance with the above described principle, as shown in FIG. 2, frequency conversion for a specific optical frequency associated with each pilot signal occurs. This will now be described in more detail.

FIG. 2 is a diagram illustrating output characteristics exhibited when pilot signals of diverse frequencies are applied to the acousto-optic tunable filter 14 according to the illustrated embodiment of the present invention. FIG. 2 is different from FIG. 1 in that beam having n optical frequencies is inputted to the acousto-optic tunable filter 14. As shown in FIG. 2, when light beams having optical frequencies of ω1, ω2, ..., and ωn are inputted to the acousto-optic tunable filter 14, along with pilot signals respectively having frequencies of f1, f2, ..., and fn, they are partially frequency-converted into optical frequencies of "ω1 +f1", "ω2 +f2", ..., and "ωn+fn", respectively, as they pass through the acousto-optic tunable filter 14. Respective remaining parts of the light beams are outputted from the acousto-optic tunable filter 14 while having their original optical frequencies of ω1, ω2, ..., and ωn. In this case, electrical signals having frequencies of f1, f2, ..., and fn can be obtained at the photo-detector 18 by appropriately adjusting the ratio between the frequency-converted beam and the non-converted beam in the same fashion as that of FIG. 1. In accordance with the same principle as that of FIG. 1, respective intensities of the light beams having optical frequencies of ω1, ω2, ..., and ωn can be measured by measuring respective magnitudes of corresponding signals respectively having frequencies of f1, f2, ..., and fn outputted from the photo-detector 18.

Accordingly, the magnitudes of the pilot signals having frequencies of f1, f2, ..., and fn, detected by the photo-detector 18, are proportional to the intensities of the light beams having optical frequencies of ω1, ω2, ..., and ωn, respectively. Thus, the intensities of the light beams having optical frequencies of ω1, ω2, ..., and ωn can be measured by calculating the magnitudes of the corresponding signals having frequencies of f1, f2, ..., and fn, respectively.

Now, a method for measuring wavelength information carried by an optical signal, based on the characteristics of the acousto-optic tunable filter 14 and photo-detector 18, and performing a frequency locking operation, based on the measured wavelength information will be described in FIG. 3.

Figure 3:
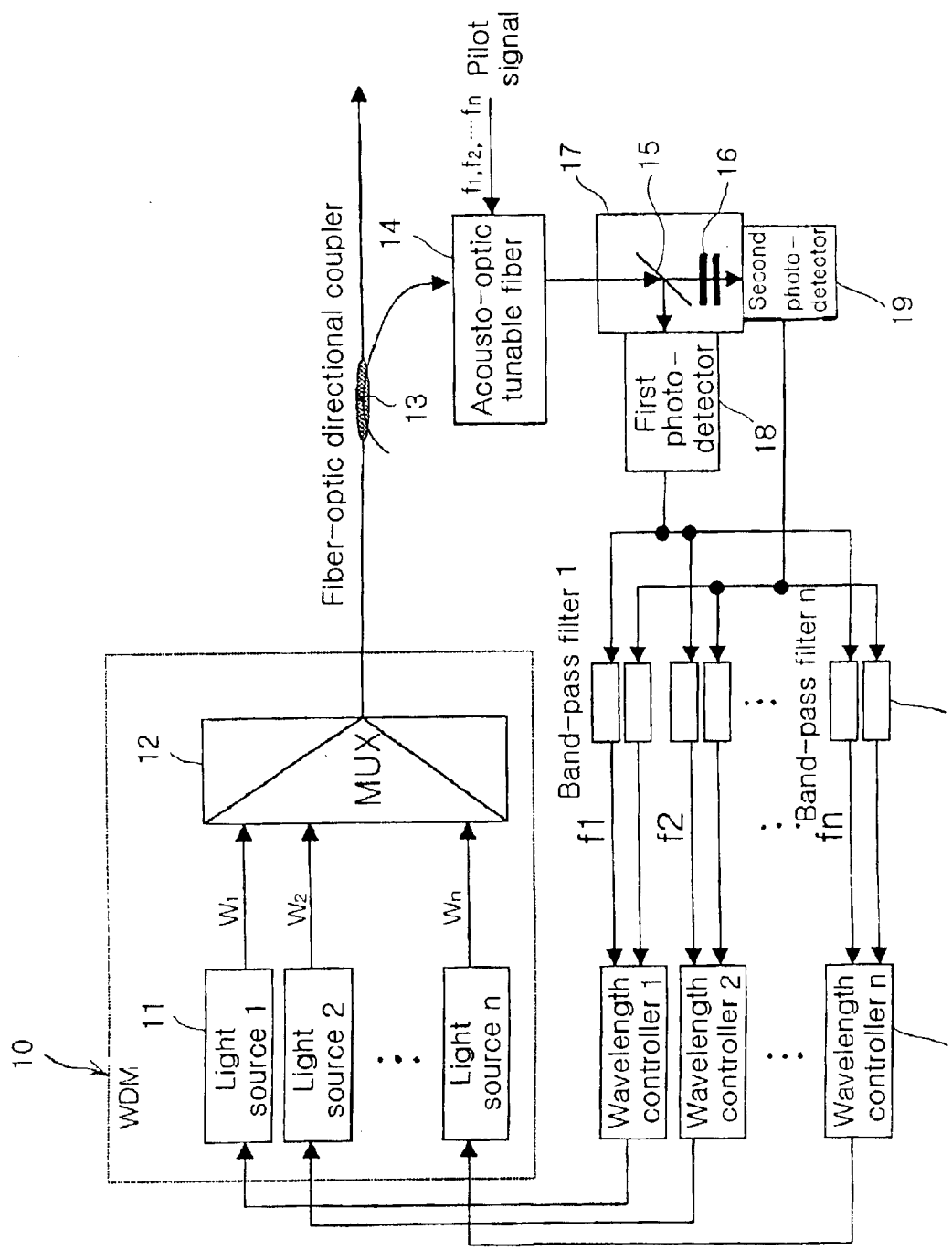
FIG. 3 is a diagram illustrating a multiwavelength locking method using the acousto-optic tunable filter according to the embodiment of the present invention.

FIG. 3 is a diagram illustrating a multiwavelength locking method using the acousto-optic tunable filter according to the illustrated embodiment of the present invention. In accordance with this method, light beams emitted from a plurality of light sources 11 while having n different optical frequencies of ω1, ω2, ..., and ωn are multiplexed using a multiplexer 12 so that they are utilized in a WDM system 10.

An optical signal obtained in accordance with the above described multiplexing operation is applied to a fiber-optic directional coupler 13 so that it is partially transmitted to a transport system (not shown) while being applied to the acousto-optic tunable filter 14 for a multiwavelength locking operation according to the present invention. The reason why a part of the optical signal obtained in accordance with the multiplexing operation of the WDM system 10 is applied from the fiber-optic directional coupler 13 to the acousto-optic tunable filter 14 is to achieve a feed-back control for allowing the light beam outputted from each of the n light sources 11 to have a fixed frequency without any variation in wavelength by applying electrical signals, corresponding to respective wavelengths of the multiplexed optical signal, to the associated light sources 11 in accordance with the principle described in conjunction with FIG. 2. The feed-back control should be achieved because the transport system may have degraded characteristics due to a variation in the wavelength of each light source 11 caused by a variation in environmental conditions such as temperature or other factors. Accordingly, the characteristics of the transport system can be stabilized by compensating for a variation in the wavelength of each light source 11 in accordance with the feed-back control, thereby allowing the light source 11 to output light beam at a fixed frequency.

As described above, n light beams split by the fiber-optic directional coupler 12 while having optical frequencies of ω1, ω2, ..., and ωn are inputted to the acousto-optic tunable filter 14, along with pilot signals respectively having frequencies of f1, f2, ..., and fn while corresponding to those optical frequencies of ω1, ω2, ..., and ωn. As the light beams pass through the acousto-optic tunable filter 14, they are partially frequency-converted at a desired rate, as shown in FIG. 2. The light beam emerging from the acousto-optic tunable filter 14 is applied to an optical splitter 15 included in the wavelength discriminator 17, and split into two light beams. One light beam from the optical splitter 15 is applied to a first photo-detector 18, and the other light beam from the optical splitter 15 is applied to a second photo-detector 19 via an Etalon filter 16. In the first photo-detector 18, respective intensities of the light beams having optical frequencies of ω1, ω2, ..., and ωn corresponding to the magnitudes of the pilot signals having frequencies of f1, f2, ..., and fn are measured in accordance with the principle described in conjunction with FIG. 2.

Meanwhile, the Etalon filter 16 has transmittance characteristics varying in accordance with a variation in wavelength. Accordingly, where light beams of different wavelengths are inputted to the Etalon filter 16, even when they have the same intensity, the Etalon filter 16 outputs light beams of different intensities. Thus, the intensity of light beam outputted from the Etalon filter 16 is related to the wavelength and intensity of light beam inputted to the Etalon filter 16. Therefore, if the intensity of the light beam inputted to the Etalon filter 16 is known, it is possible to measure the wavelength of that light beam. Thus, it is possible to detect the intensity and wavelength of the light beam inputted to the second photo-detector 19.

As apparent from the above description, one of the two light beams outputted from the optical splitter 15 is used to measure the intensity of the input light beam, whereas the other light beam is inputted to the Etalon filter 16 so as to measure the intensity and wavelength of the input beam. When two electrical signals respectively detected by the first and second photo-detectors 18 and 19 are compared with each other, it is possible to determine information about respective optical frequencies.

The electrical signals detected by the photo-detectors 18 and 19 are applied to band-pass filters 22, respectively. Each band-pass filter 22 allows a particular one of multiple frequency components, contained in the input light beam, to pass therethrough while removing the remaining frequency components other than the particular frequency component. There are a number of band-pass filters 22 so that each of the band-pass filters 22 outputs a signal corresponding to the optical frequency of an associated one of the light sources. This will be described in more detail. The light beam inputted to each of the photo-detectors 18 and 19 has n wavelengths. Accordingly, each of the photo-detectors 18 and 19 outputs n frequencies in association with each of the n pilot signals applied to the acousto-optic tunable filter 14. Where the n frequencies are in a mixed state, it is impossible to distinguish those frequencies from one another, so that the wavelength information associated with a selected frequency cannot be determined. In order to measure a particular frequency component, the band-pass filters 22 are used. In accordance with the use of the band-pass filters 22, information about the wavelength and intensity of light beam emitted from each light source can be obtained. For example, the first band-pass filter outputs the intensity and wavelength of light beam associated with the frequency of f1, whereas the second band-pass filter outputs the intensity and wavelength of light beam associated with the frequency of f2. Thus, wavelength information about the frequency of each light source is obtained. Although n frequencies are separated from one another using the band-pass filters, other devices may be used, in so far as they can separate an optical signal into components of different frequencies. For example, a radio frequency (RF) spectrum analyzer may be used.

N band-pass filters 22 should be used to achieve a filtering operation for n beams outputted from the first photo-detector 18. In order to achieve a filtering operation for n beams outputted from the second photo-detector 18, n band-pass filters 22 are also required. Accordingly, 2n band-pass filters 22 are required. Of course, the present invention is not limited to this arrangement. Each band-pass filter 22 may be used for both the first and second photo-detectors 18 and 19.

Using each band-pass filter 22, it is possible to measure the value of a particular frequency associated with the band-pass filter 22, from the electrical signal detected by the first photo-detector 18. Thus, respective optical intensities corresponding to n optical frequencies can be measured. Similarly, it is possible to measure the value of a particular frequency from the electrical signal detected by the second photo-detector 19 after being filtered by the Etalon filter 16, using an associated one of the band-pass filters 22. Thus, respective optical intensities and optical wavelengths corresponding to the n optical frequencies can be measured in accordance with an addition of the characteristics of the Etalon filter 16.

Thereafter, wavelength information about the optical frequency of each light source 11 is detected by a wavelength controllers 21. In order to detect the wavelength information, the wavelength controller 21 uses electrical signals representing respective wavelengths detected by the photo-detectors 18 and 19. The detected wavelength information is compared with a wavelength desired by the associated light source 11. When there is a difference between the compared wavelengths, the wavelength controller 21 applies a control signal to the associated light source 11 so as to vary the environmental conditions (mainly, temperature) of that light source 11, thereby allowing the light source 11 to output a desired wavelength. Thus, the light source 11 outputs light beam at a locked frequency. The frequency locking can be achieved in a conventional manner by adjusting the wavelength of the beam emitted from the light source in such a fashion that the ratio between the signal magnitudes respectively detected by the first and second photo-detectors 18 and 19 is constant at all optical frequencies.

In accordance with the present invention, a variation in the output wavelength of a light source depending on a variation in the wavelength of the light source is monitored under the condition in which no pilot signal is directly applied to the light source. Based on the monitored result, the varied wavelength of the light source is compensated for. Thus, a locked wavelength is outputted. Although a pilot signal may be directly applied to the light source, a degradation in transmission characteristics may occur because the wavelength or output intensity of the light source may vary due to the pilot signal.

Thus, the multiwavelength locking method of the present invention may be very useful for an optical communication system including optical transport networks, as compared to conventional locking methods.

There is no limitation on the numbers and wavelengths of light sources, directional couplers, band-pass filters, wavelength controllers, photo-detectors, and wavelength discriminators used in the present invention. Those numbers and wavelengths may be appropriately determined in accordance with the system, to which the present invention is applied. Although the apparatus carrying out the multiwavelength locking method of the present invention has been described as being applied to an optical communication system using optical transport networks, it may be applied to other systems. Although the preferred embodiments of the invention have been disclosed for illustrative purposes, those skilled in the art will appreciate that various modifications, additions and substitutions are possible, without departing from the scope and spirit of the invention as disclosed in the accompanying claims.

As apparent from the above description, the present invention provides a multiwavelength locking method and apparatus capable of locking diverse wavelengths without directly applying pilot signals to light sources, thereby eliminating influence of noise on pilot signals. Accordingly, the multiwavelength locking method and apparatus can be very useful for optical communication systems including optical transport networks.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A multiwavelength locking method using an acousto-optic tunable filter being connected to output terminals of N light sources and outputting beams of N different wavelengths outputted from the light sources in the form of an output beam having N frequencies, the multiwavelength locking method comprising the steps of:

(A) applying the output beam having the N frequencies outputted from a multiplexer and N pilot signals to an acousto-optic tunable filter;

(B) splitting an output beam outputted from the acousto-optic tunable filter, the output beam having the N frequencies, into two beams, detecting an intensity signal from a first one of the split beams, and detecting a wavelength signal and an intensity signal from a second one of the split beams;

(C) detecting intensity signals of the first beam respectively corresponding to the N frequencies, and detecting intensity signals and wavelength signals of the second beam respectively corresponding to the N frequencies; and (D) detecting wavelength signals respectively corresponding to the light sources on the basis of the intensity signals of the first beam and the intensity signals and the wavelength signals of the second beam according to the N frequencies, comparing each of the detected wavelength signals with each of wavelength signals of the beams outputted from the light sources, and compensating for a difference between the compared wavelength signals.

2. The multiwavelength locking method according to claim 1, wherein the step (A) comprises the step of performing a frequency conversion for the output light having a specific frequency corresponding to the pilot signal.

3. The multiwavelength locking method according to claim 2, wherein the ratio of the frequency-converted beams to non-converted beams of the output beams is controlled by respective intensities of the associated pilot signals.

4. The multiwavelength locking method according to claim 2, wherein each of the frequency-converted beams has a frequency corresponding to the sum of the frequencies of the output beams and the frequencies of the pilot signals associated with the beams.

5. The multiwavelength locking method according to claim 1, wherein the partial beam of the output beam outputted from the multiplexer is inputted to acousto-optic tunable filter at the step (A).

6. The multiwavelength locking method according to claim 1, wherein the second beam is applied to a filter for the detection of the wavelength signals and the intensity signals from the second beam at the step (B).

7. The multiwavelength locking method according to claim 1, wherein the output beam is applied to a wavelength discriminator for the detection of the intensity signal from the output beam at the step (B).

8. The multiwavelength locking method according to claim 7, wherein the wavelength discriminator comprises an Etalon filter, an arrayed waveguide grating filter, or a fiber Bragg grating filter, the filters having a wavelength dependency.

9. The multiwavelength locking method according to claim 1, wherein the wavelengths respectively outputted from the N light sources are simultaneously locked.

10. A multiwavelength locking apparatus using an acousto-optic tunable filter being connected to output terminals of N light sources and locking output wavelengths of the light sources using respective light beams of N different wavelengths outputted from the light sources, comprising an optical splitter, a wavelength detecting filter, a wavelength discriminator, a photo-detector, and a frequency filter adapted to allow signals of a specific frequency to pass therethrough, further comprising:

an acousto-optic tunable filter for receiving the light beams having N different frequencies respectively outputted from the light sources, along with N pilot signals having N different frequencies respectively, and converting each of the frequencies of output beams corresponding to the N pilot signals, whereby, the N frequency-converted output beams from the acousto-optic tunable filter are inputted to the photo-detector, then N electrical signals respectively corresponding to the N frequencies of the pilot signals are outputted through the photo-detector, separated from one another according to the light sources respectively, and then used to compensate for each of the output wavelengths of the light sources, thereby enabling the corresponding light sources to output locked wavelengths respectively.

11. The multiwavelength locking apparatus according to claim 10, wherein the acousto-optic tunable filter controls the ratio of the frequency-converted beams to non-converted beams of the output beams by controlling respective intensities of the corresponding pilot signals.

12. The multiwavelength locking apparatus according to claim 10, wherein each of the frequency-converted beam has a frequency corresponding to the sum of the frequency of the output beam associated with the beam the frequency of the pilot signal associated with the beam in the acousto-optic tunable filter.

13. The multiwavelength locking apparatus according to claim 10, wherein each of the wavelengths outputted from the N light sources are simultaneously locked by simultaneously inputting the pilot signals.

14. The multiwavelength locking apparatus according to claim 10, wherein the magnitudes of the electrical signals outputted from the photo-detector and those of the frequencies of the pilot signals are the same, respectively.

* * * * *